(12) United States Patent
Matsuzaki et al.

(10) Patent No.: US 9,379,015 B2
(45) Date of Patent: Jun. 28, 2016

(54) WAFER PROCESSING METHOD

(71) Applicant: Disco Corporation, Tokyo (JP)

(72) Inventors: Sakae Matsuzaki, Tokyo (JP); Junichi Arami, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 89 days.

(21) Appl. No.: 14/069,705

(22) Filed: Nov. 1, 2013

(65) Prior Publication Data

US 2014/0141596 A1 May 22, 2014

(30) Foreign Application Priority Data

Nov. 22, 2012 (JP) .................. 2012-256603

(51) Int. Cl.
- *H01L 21/00* (2006.01)
- *H01L 21/78* (2006.01)
- *B23K 26/40* (2014.01)

(52) U.S. Cl.
CPC .............. *H01L 21/78* (2013.01); *B23K 26/364* (2015.10); *B23K 26/40* (2013.01); *B23K 2201/40* (2013.01); *B23K 2203/172* (2015.10)

(58) Field of Classification Search
CPC ... H01L 21/78; H01L 23/544; H01L 2924/14; H01L 21/6836; H01L 2223/54453
USPC .......... 438/462; 257/E21.21, E21.6, E21.219, 257/E21.599
See application file for complete search history.

(56) References Cited

U.S. PATENT DOCUMENTS

| | | | |
|---|---|---|---|
| 2004/0161940 A1* | 8/2004 | Daii et al. ..................... | 438/706 |
| 2006/0154447 A1* | 7/2006 | Kushima et al. .............. | 438/460 |
| 2009/0191690 A1* | 7/2009 | Boyle et al. ................... | 438/462 |
| 2011/0312157 A1* | 12/2011 | Lei et al. ....................... | 438/462 |

FOREIGN PATENT DOCUMENTS

JP   2009-021476   1/2009

* cited by examiner

*Primary Examiner* — Charles Garber
*Assistant Examiner* — Abdulfattah Mustapha
(74) *Attorney, Agent, or Firm* — Greer Burns & Crain, Ltd.

(57) ABSTRACT

A wafer processing method divides a wafer into individual devices along crossing streets formed on the front side of the wafer. The wafer has a substrate and a functional layer formed on the front side of the substrate. The individual devices are formed from the functional layer and are partitioned by the streets. A laser beam is applied along the streets from the front side of the functional layer to thereby remove the functional layer along the streets. A resist film is formed on the front side of the functional layer except on each street. The substrate of the wafer is plasma-etched along each street where the functional layer is absent to the depth corresponding to the finished thickness of each device, thereby forming a division groove along each street and also etching off a modified layer formed on the opposite sides of each street.

3 Claims, 10 Drawing Sheets

WAFER PROCESSING METHOD

BACKGROUND OF THE INVENTION

1. Field of the Invention

The present invention relates to a wafer processing method for dividing a wafer into a plurality of individual devices along a plurality of crossing streets formed on the front side of the wafer, the wafer being composed of a substrate and a functional layer formed on the front side of the substrate, the functional layer being composed of an insulating film and a functional film formed on the insulating film, the individual devices being formed from the functional layer and partitioned by the streets.

2. Description of the Related Art

As well known in the art, in a semiconductor device fabrication process, a functional layer composed of an insulating film and a functional film is formed on the front side of a substrate such as a silicon substrate, and a plurality of devices such as ICs and LSIs are formed like a matrix from this functional layer, thus obtaining a semiconductor wafer having the plural devices. The plural devices are partitioned by a plurality of division lines called streets formed on the front side of the semiconductor wafer. The semiconductor wafer is divided along these streets to obtain the individual devices. Division of the semiconductor wafer along the streets is usually performed by using a cutting apparatus called a dicing saw. This cutting apparatus includes a chuck table for holding the semiconductor wafer as a workpiece, cutting means having a cutting blade for cutting the semiconductor wafer held on the chuck table, and moving means for relatively moving the chuck table and the cutting means.

In recent years, a semiconductor wafer intended to improve the processing performance of devices such as ICs and LSIs has been put into practical use. This semiconductor wafer is composed of a substrate such as a silicon substrate and a functional layer formed on the front side of the substrate. The functional layer is composed of a low-permittivity insulator film (Low-k film) and a functional film formed on the Low-k film, the functional film forming a plurality of circuits. Thus, the devices are formed from the functional layer. For example, the Low-k film is formed of a glassy material such as $SiO_2$, SiO, and SiN. The Low-k film is different in material from the substrate constituting the wafer, so that it is difficult to cut the substrate together with the Low-k film by using the cutting blade. That is, the Low-k film is very brittle like mica. Accordingly, when the semiconductor wafer having the Low-k film is cut along the streets by using the cutting blade, there arises a problem such that the Low-k film may be separated and this separation may reach the circuits to cause fatal damage to the devices.

To solve this problem, Japanese Patent Laid-open No. 2009-21476 discloses a wafer dividing method including the steps of forming a laser processed groove along each street formed on the semiconductor wafer to thereby remove the functional layer along each street and next cutting the semiconductor wafer along each street by using a cutting blade in such a manner that the cutting blade is aligned with each laser processed groove where the functional layer is absent and the cutting blade and the semiconductor wafer are relatively moved.

SUMMARY OF THE INVENTION

However, in forming the laser processed groove along each street of the semiconductor wafer to thereby remove the functional layer along each street, a modified layer is formed on the upper surface of the substrate of the semiconductor wafer along each street. Accordingly, even when the substrate is cut along each street (laser processed groove) by using the cutting blade, the modified layer is left on the opposite sides of each street. That is, the modified layer is left along the peripheral edge of each device on the front side of the substrate, causing a reduction in die strength of each device.

It is therefore an object of the present invention to provide a wafer processing method which can reliably divide a wafer into the individual devices along the streets without a reduction in die strength of each device, wherein the wafer includes a substrate and a functional layer formed on the front side of the substrate and the devices are formed from the functional layer.

In accordance with an aspect of the present invention, there is provided a wafer processing method for dividing a wafer into a plurality of individual devices along a plurality of crossing streets formed on the front side of the wafer, the wafer being composed of a substrate and a functional layer formed on the front side of the substrate, the individual devices being formed from the functional layer and partitioned by the streets, the wafer processing method including: a functional layer removing step of applying a laser beam along the streets formed on the wafer from the front side of the functional layer of the wafer to thereby remove the functional layer along the streets; a resist film forming step of forming a resist film on the front side of the functional layer of the wafer in an area except each street after performing the functional layer removing step; a plasma etching step of plasma-etching the substrate of the wafer along each street where the functional layer is absent to the depth corresponding to the finished thickness of each device after performing the resist film forming step, thereby forming a division groove along each street and also etching off a modified layer formed on the opposite sides of each street in the functional layer removing step; a protective member attaching step of attaching a protective member to the front side of the functional layer of the wafer after performing the plasma etching step; and a back grinding step of grinding the back side of the substrate to reduce the thickness of the substrate to the finished thickness of each device after performing the protective member attaching step, thereby exposing each division groove to the back side of the substrate and accordingly dividing the wafer into the individual devices.

Preferably, the plasma etching step includes a modified layer removing step of removing the modified layer formed on the opposite sides of each street by using $SF_6$ and a division groove forming step of forming the division groove along each street by alternately using $SF_6$ and $C_4F_8$.

Preferably, the wafer processing method further includes a protective film forming step of applying a liquid resin to the front side of the functional layer of the wafer to thereby form a protective film before performing the functional layer removing step.

Preferably, the wafer processing method further includes a wafer supporting step of attaching the back side of the substrate of the wafer to an adhesive tape supported to an annular frame and peeling off the protective member attached to the front side of the functional layer of the wafer after performing the back grinding step.

According to the present invention, the modified layer formed on the opposite sides of each street in the functional layer removing step is etched off by performing the plasma etching step, so that the die strength of each device can be improved. Furthermore, each division groove is formed by plasma etching, so that chipping due to the use of a cutting blade can be avoided to thereby further improve the die strength of each device.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
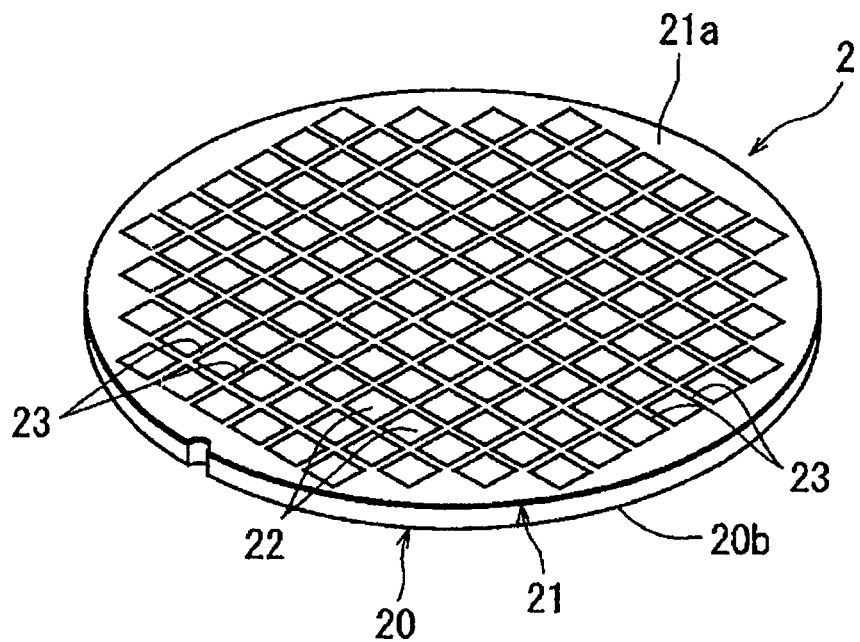
FIG. 1A is a perspective view of a semiconductor wafer to be divided by the wafer processing method according to the present invention.
Figure 1B:
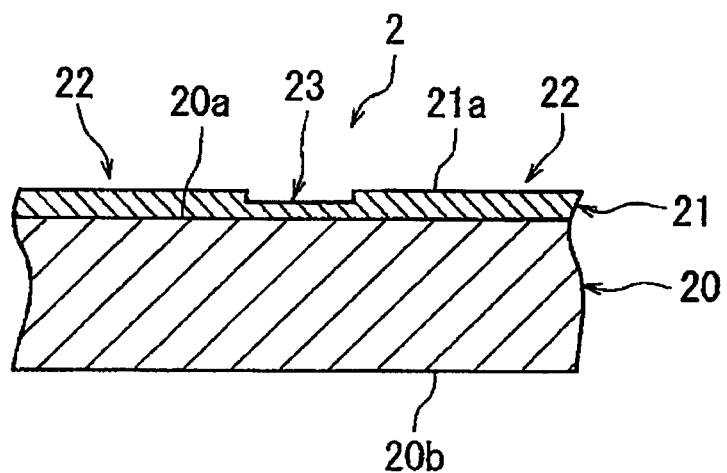
FIG. 1B is an enlarged sectional view of an essential part of the semiconductor wafer shown in FIG. 1A.

The wafer processing method according to the present invention will now be described in more detail with reference to the attached drawings. FIG. 1A is a perspective view of a semiconductor wafer 2 to be divided into individual devices by the wafer processing method according to the present invention, and FIG. 1B is an enlarged sectional view of an essential part of the semiconductor wafer 2 shown in FIG. 1A. As shown in FIGS. 1A and 1B, the semiconductor wafer 2 is composed of a silicon substrate 20 and a functional layer 21 formed on the front side 20a of the silicon substrate 20. For example, the silicon substrate 20 has a thickness of 725 μm and a diameter of 200 mm. The functional layer 21 is composed of an insulating film and a functional film formed on the insulating film, the functional film forming a plurality of circuits. A plurality of devices 22 such as ICs and LSIs are formed like a matrix from the functional layer 21. For example, the thickness of the functional layer 21 is set to 10 μm. These devices 22 are partitioned by a plurality of crossing streets 23 formed on the functional layer 21. In this preferred embodiment, the insulating film constituting the functional layer 21 is provided by an $SiO_2$ film or a low-permittivity insulator film (Low-k film). Examples of the Low-k film include an inorganic film of SiOF, BSG (SiOB), etc. and an organic film such as a polymer film of polyimide, parylene, etc.

Figure 2A:
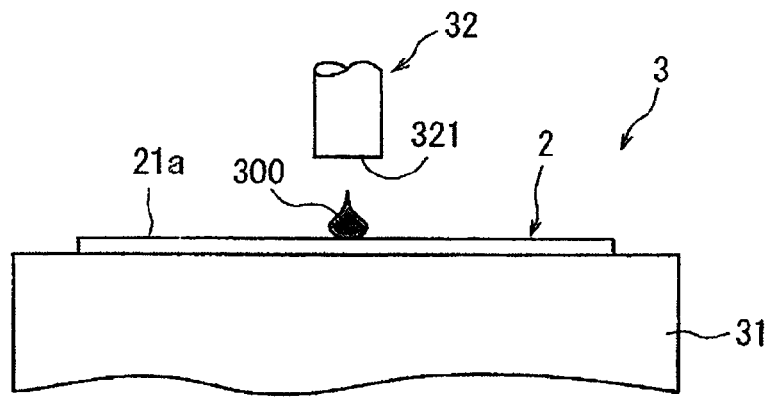
FIGS. 2A to 2C are views for illustrating a protective film forming step in the wafer processing method according to the present invention.
Figure 2B:
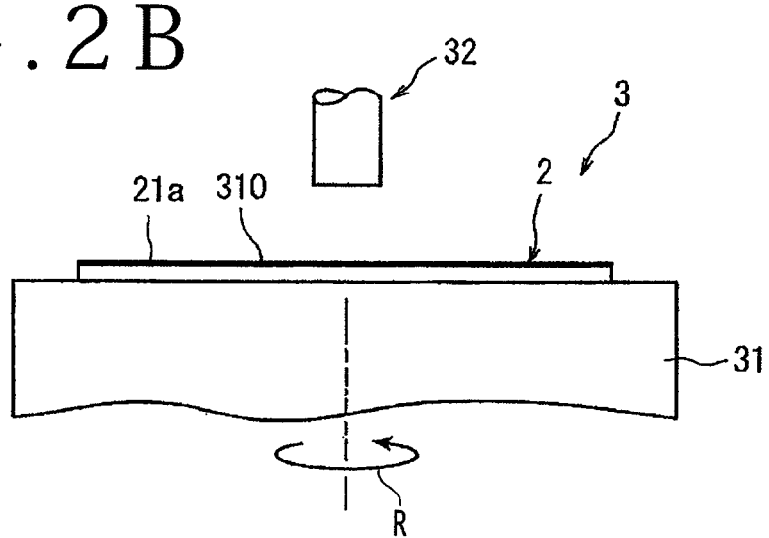

In the wafer processing method for dividing the semiconductor wafer 2 along the streets 23, a protective film forming step is performed in such a manner that a liquid resin is applied to the front side 21a of the functional layer 21 constituting the semiconductor wafer 2 to thereby form a protective film for protecting the devices 22. This protective film forming step will now be described with reference to FIGS. 2A to 2C. As shown in FIGS. 2A and 2B, the semiconductor wafer 2 is placed on a spinner table 31 constituting a protective film forming apparatus 3 in the condition where the back side 20b (see FIG. 2C) of the silicon substrate 20 constituting the semiconductor wafer 2 is in contact with the spinner table 31. Thereafter, suction means (not shown) is operated to hold the semiconductor wafer 2 on the spinner table 31 under suction. Accordingly, the semiconductor wafer 2 is held on the spinner table 31 in the condition where the front side 21a of the functional layer 21 constituting the semiconductor wafer 2 is oriented upward as shown in FIG. 2A.

After holding the semiconductor wafer 2 on the spinner table 31 under suction as mentioned above, an outlet opening 321 of a liquid resin nozzle 32 constituting the protective film forming apparatus 3 is positioned directly above the center of the semiconductor wafer 2 held on the spinner table 31 and liquid resin supplying means (not shown) is next operated to drop a predetermined amount of liquid resin 300 from the outlet opening 321 of the liquid resin nozzle 32 as shown in FIG. 2A. Preferably, the liquid resin 300 is provided by a water-soluble resin such as PVA (Poly Vinyl Alcohol), PEG (Poly Ethylene Glycol), and PEO (Poly Ethylene Oxide). For example, the amount of the liquid resin 300 to be supplied is set to 10 to 20 milliliters (ml) in the case that the diameter of the semiconductor wafer 2 is 200 mm.

Figure 2C:
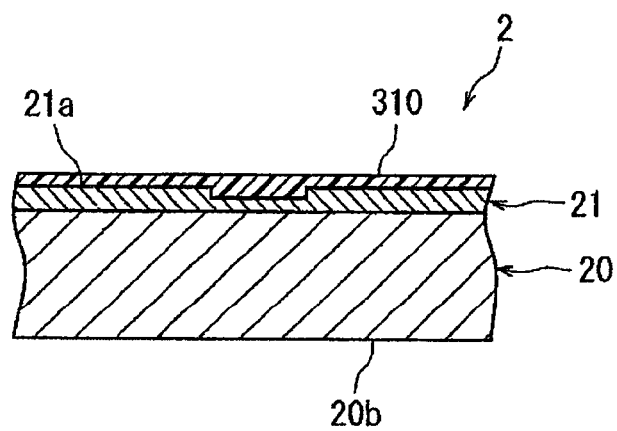

After supplying the liquid resin 300 by a predetermined amount to the central area of the front side 21a of the functional layer 21 constituting the semiconductor wafer 2 as mentioned above, the spinner table 31 is rotated in the direction shown by an arrow R in FIG. 2B at 100 rpm for 5 seconds, for example. As a result, the liquid resin 300 supplied to the central area of the front side 21a of the functional layer 21 constituting the semiconductor wafer 2 is made to flow toward the outer circumference of the semiconductor wafer 2 by the action of a centrifugal force, so that the liquid resin 300 is spread over the entire surface of the front side 21a of the functional layer 21 of the semiconductor wafer 2. Accordingly, as shown in FIGS. 2B and 2C, a protective film 310 having a thickness of 0.2 to 10 μm is formed from the liquid resin 300 (protective film forming step). The thickness of the protective film 310 can be adjusted according to the supply amount of the liquid resin 300, the rotational speed of the spinner table 31, and the rotational time of the spinner table 31.

Figure 3:
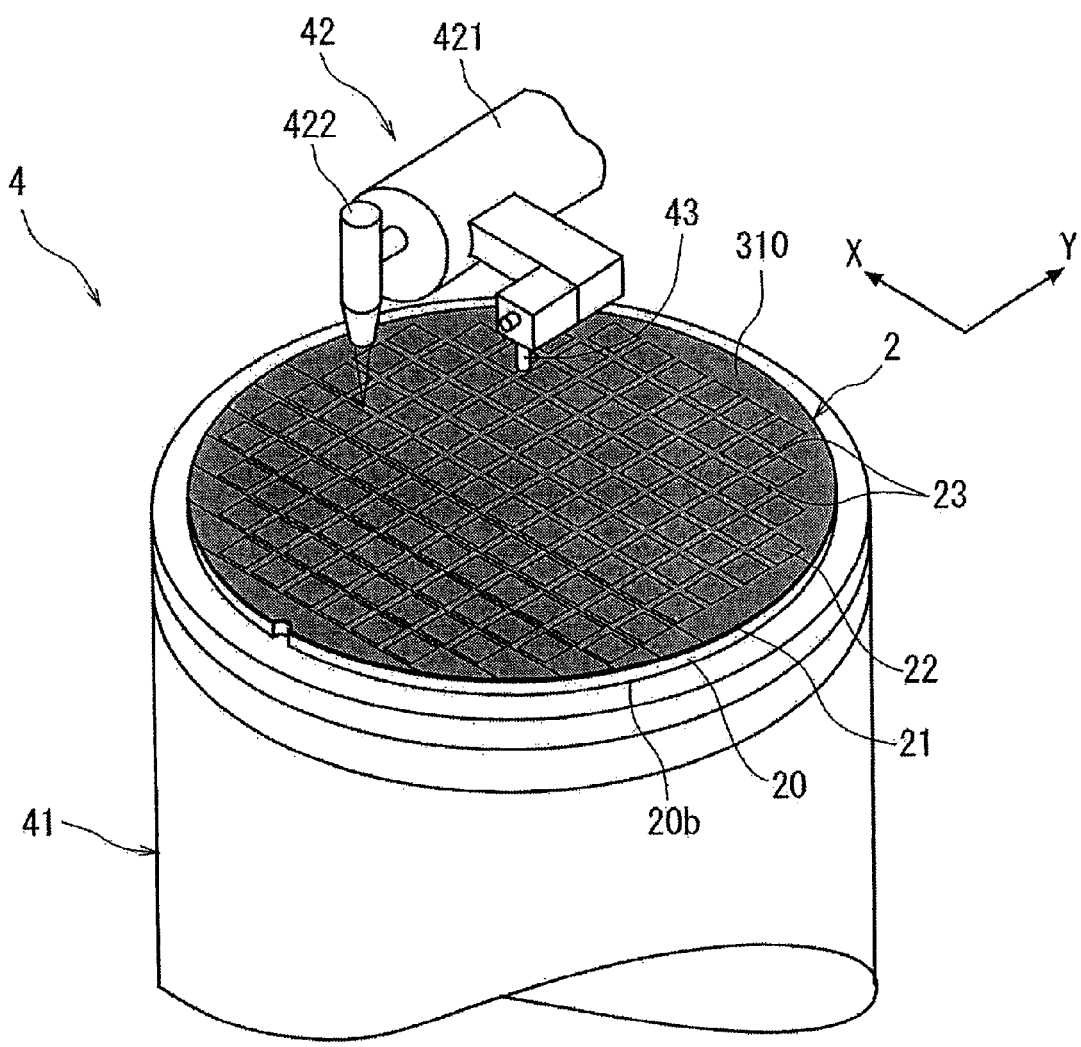
FIG. 3 is a perspective view of an essential part of a laser processing apparatus for performing a functional layer removing step in the wafer processing method according to the present invention.

After performing the protective film forming step mentioned above, a functional layer removing step is performed in such a manner that a laser beam is applied along the streets 23 from the front side 21a of the functional layer 21 of the semiconductor wafer 2 to thereby remove the functional layer 21 along the streets 23. This functional layer removing step is performed by using a laser processing apparatus 4 shown in FIG. 3. As shown in FIG. 3, the laser processing apparatus 4 includes a chuck table 41 for holding a workpiece, laser beam applying means 42 for applying a laser beam to the workpiece held on the chuck table 41, and imaging means 43 for imaging the workpiece held on the chuck table 41. The chuck table 41 has an upper surface as a holding surface for holding the workpiece thereon under suction. The chuck table 41 is movable both in the feeding direction shown by an arrow X in FIG. 3 by feeding means (not shown) and in the indexing direction shown by an arrow Y in FIG. 3 by indexing means (not shown).

The laser beam applying means 42 includes a cylindrical casing 421 extending in a substantially horizontal direction. Although not shown, the casing 421 contains pulsed laser beam oscillating means including a pulsed laser beam oscillator and repetition frequency setting means. The pulsed laser beam oscillator is provided by a YAG laser oscillator or a YVO4 laser oscillator, for example. The laser beam applying means 42 further includes focusing means 422 mounted on the front end of the casing 421 for focusing a pulsed laser beam oscillated by the pulsed laser beam oscillating means. The imaging means 43 is mounted on a front end portion of the casing 421 constituting the laser beam applying means 42 and includes optical means such as a microscope and a CCD camera. An image signal output from the imaging means 43 is transmitted to control means (not shown).

The functional layer removing step using the laser processing apparatus 4 will now be described with reference to FIG. 3 and FIGS. 4A to 4C. First, the semiconductor wafer 2 is placed on the chuck table 41 of the laser processing apparatus 4 in the condition where the back side 20b of the silicon substrate 20 of the semiconductor wafer 2 is in contact with the chuck table 41 as shown in FIG. 3. Thereafter, suction means (not shown) is operated to hold the semiconductor wafer 2 on the chuck table 41 under suction. Accordingly, the protective film 310 formed on the front side 21a of the functional layer 21 of the semiconductor wafer 2 held on the chuck table 41 is oriented upward.

Thereafter, the chuck table 41 holding the semiconductor wafer 2 is moved to a position directly below the imaging means 43 by operating the feeding means (not shown). In the condition where the chuck table 41 is positioned directly below the imaging means 43, an alignment operation is performed by the imaging means 43 and the control means (not shown) to detect a subject area of the semiconductor wafer 2 to be laser-processed. More specifically, the imaging means 43 and the control means perform image processing such as pattern matching for making the alignment of the streets 23 extending in a first direction on the functional layer 21 of the semiconductor wafer 2 and the focusing means 422 of the laser beam applying means 42 for applying the laser beam to the semiconductor wafer 2 along the streets 23, thus performing the alignment of a laser beam applying position. Similarly, the alignment of a laser beam applying position is performed for the other streets 23 extending in a second direction perpendicular to the first direction on the functional layer 21.

Figure 4A:
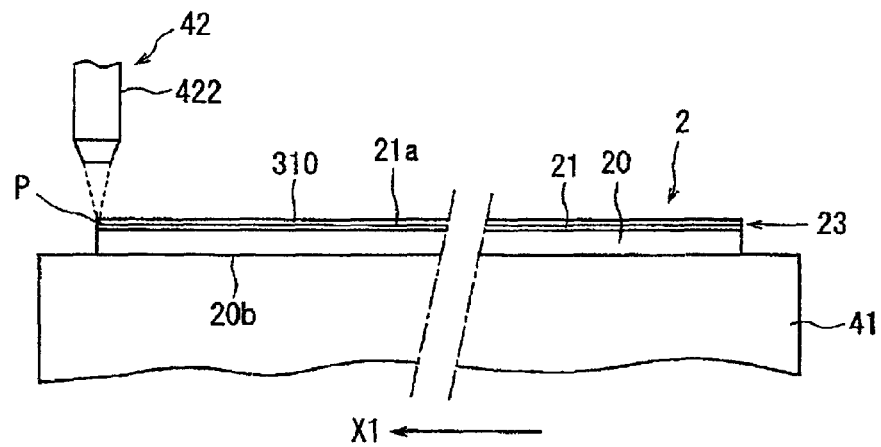
FIGS. 4A to 4C are views for illustrating the functional layer removing step.
Figure 4B:
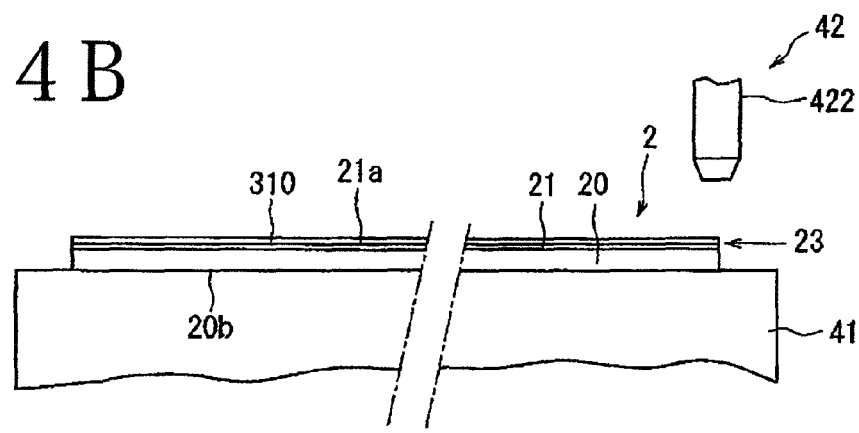

After performing the alignment operation mentioned above to detect all of the streets 23 of the semiconductor wafer 2 held on the chuck table 41, the chuck table 41 is moved to a laser beam applying area where the focusing means 422 of the laser beam applying means 42 is located as shown in FIG. 4A, thereby positioning one end (left end as viewed in FIG. 4A) of a predetermined one of the streets 23 extending in the first direction directly below the focusing means 422 of the laser beam applying means 42. Further, the focal point P of the pulsed laser beam to be applied from the focusing means 422 is set near the upper surface of the predetermined street 23. Thereafter, the pulsed laser beam is applied from the focusing means 422 to the wafer 2, and the chuck table 41 is moved in the direction shown by an arrow X1 in FIG. 4A at a predetermined feed speed. When the other end (right end as viewed in FIG. 4B) of the predetermined street 23 reaches the position directly below the focusing means 422 as shown in FIG. 4B, the application of the pulsed laser beam is stopped and the movement of the chuck table 41 is also stopped.

Figure 4C:
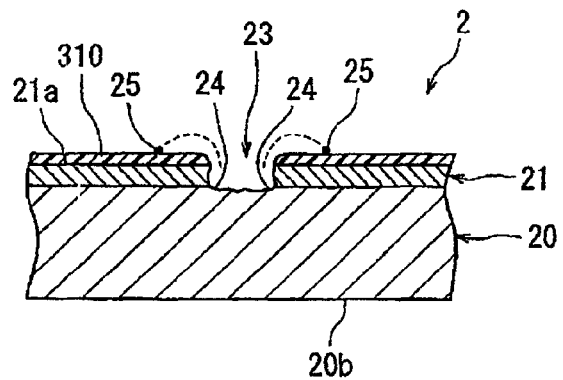

By performing this functional layer removing step, the protective film 310 and the functional layer 21 are removed along the predetermined street 23 as shown in FIG. 4C. The functional layer removing step mentioned above is similarly performed along all of the streets 23 extending in the first direction on the semiconductor wafer 2. When the functional layer 21 is removed along the streets 23 by performing the functional layer removing step, a modified layer 24 produced by the application of the laser beam is left on the opposite sides of each street 23 as shown in FIG. 4C. Further, debris 25 is also produced by the application of the laser beam. However, since the protective film 310 is formed on the front side 21a of the functional layer 21 of the semiconductor wafer 2 except each street 23, the debris 25 is blocked by the protective film 310 as shown in FIG. 4C and there is no possibility that the debris 25 may stick to the devices 22 formed on the front side 21a of the functional layer 21.

For example, the functional layer removing step mentioned above is performed under the following processing conditions.

Light source of the laser beam: YVO4 laser or YAG laser
Wavelength: 355 nm
Repetition frequency: 10 to 100 kHz
Power: 4 to 10 W
Focused spot diameter: $\phi 0$ to $\phi 00$ μm
Work feed speed: 50 to 200 mm/s After performing the functional layer removing step along all of the streets 23 extending in the first direction on the semiconductor wafer 2, the chuck table 41 is rotated 90° to similarly perform the functional layer removing step along all of the other streets 23 extending in the second direction perpendicular to the first direction on the semiconductor wafer 2.

After finishing the functional layer removing step as mentioned above, a protective film removing step is performed to remove the protective film 310 formed on the front side 21a of the functional layer 21 of the semiconductor wafer 2. Since the protective film 310 formed on the front side 21a of the functional layer 21 of the semiconductor wafer 2 is formed of a water-soluble resin as mentioned above, the protective film 310 can be easily removed by using water.

Figure 5A:
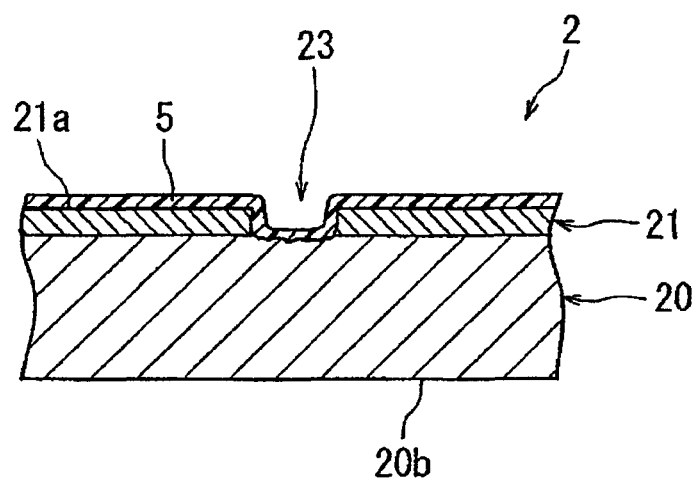
FIGS. 5A and 5B are sectional views for illustrating a resist film forming step in the wafer processing method according to the present invention.
Figure 5B:
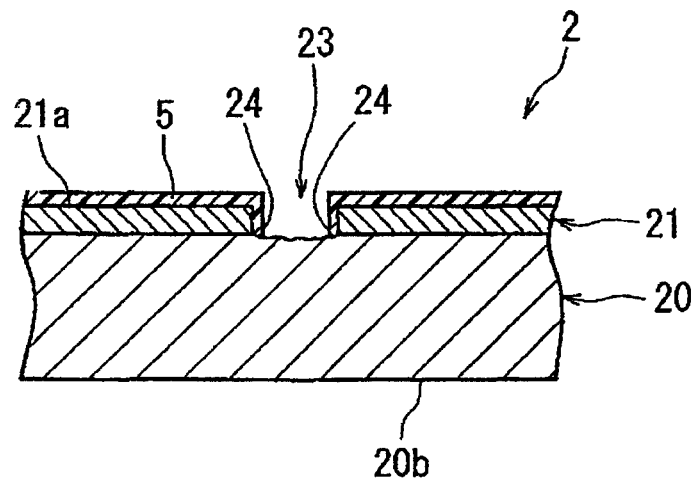

After performing the protective film removing step mentioned above, a resist film forming step is performed in such a manner that a resist film is formed on the front side 21a of the functional layer 21 of the semiconductor wafer 2 in an area except each street 23. More specifically, as shown in FIG. 5A, a positive photoresist is applied to the front side 21a of the functional layer 21 of the semiconductor wafer 2 processed by the protective film removing step, thereby forming a photoresist film 5 (photoresist applying step). Thereafter, the photoresist film 5 is masked in the area (non-etching area) except each street 23 and then exposed to light (exposing step). Thereafter, the photoresist film 5 exposed to light is developed by using an alkaline solution (developing step). As a result, the photoresist film 5 is removed in only the area corresponding to each street 23 as shown in FIG. 5B. Accordingly, the photoresist film 5 is left on the front side 21a of the functional layer 21 of the semiconductor wafer 2 in the other area except each street 23.

Figure 6:
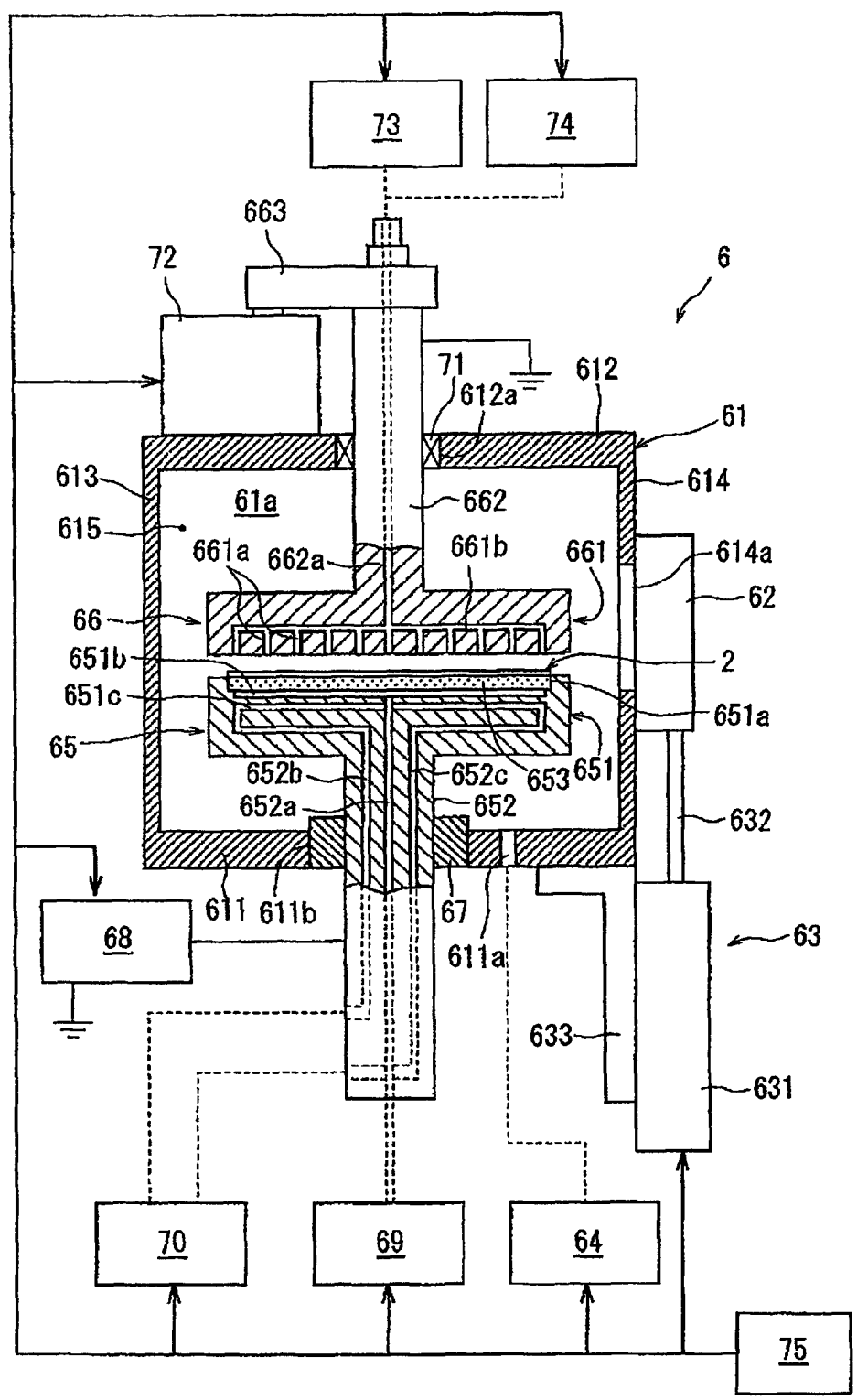
FIG. 6 is a sectional view of an essential part of a plasma etching apparatus for performing a plasma etching step in the wafer processing method according to the present invention.

After performing the resist film forming step mentioned above, a plasma etching step is performed in such a manner that the silicon substrate 20 of the semiconductor wafer 2 is plasma-etched along each street 23 to the depth corresponding to the finished thickness of each device 22, thereby forming a division groove along each street 23 and that the modified layer 24 formed on the opposite sides of each street 23 in the functional layer removing step is also etched off. This plasma etching step is performed by using a plasma etching apparatus 6 shown in FIG. 6. As shown in FIG. 6, the plasma etching apparatus 6 includes a housing 61 defining an enclosed space 61a. The housing 61 is composed of a bottom wall 611, top wall 612, left side wall 613, right side wall 614, rear side wall 615, and front side wall (not shown). The right side wall 614 is formed with an opening 614a for loading and unloading a workpiece. A gate 62 for closing the opening 614a is provided outside the opening 614a so as to be vertically movable. The gate 62 is operated by gate operating means 63. The gate operating means 63 is composed of an air cylinder 631 and a piston rod 632 connected to a piston (not shown) provided in the air cylinder 631. The air cylinder 631 is mounted through a bracket 633 to the bottom wall 611 of the housing 61, and the front end (upper end as viewed in FIG. 6) of the piston rod 632 is connected to the gate 62. When the gate 62 is opened by the gate operating means 63, the semiconductor wafer 2 as a workpiece processed by the resist film forming step can be loaded through the opening 614a. Further, the bottom wall 611 of the housing 61 is formed with a gas outlet 611a, and this gas outlet 611a is connected to evacuating means 64.

A lower electrode 65 and an upper electrode 66 are opposed to each other in the enclosed space 61a defined by the housing 61. The lower electrode 65 is formed of a conductive material, and it is composed of a disk-shaped work holding portion 651 and a cylindrical supporting portion 652 projecting downward from the lower surface of the work holding portion 651 at a central portion thereof. The cylindrical supporting portion 652 of the lower electrode 65 is inserted through a hole 611b formed in the bottom wall 611 of the housing 61 and is supported through an insulator 67 to the bottom wall 611 in a sealed condition. The lower electrode 65 supported to the bottom wall 611 of the housing 61 in this manner is electrically connected through the supporting portion 652 to an RF power supply 68.

The upper portion of the work holding portion 651 constituting the lower electrode 65 is formed with a circular recess 651a opening upward, and a disk-shaped suction holding member 653 formed of a porous ceramic material is fitted in the circular recess 651a. A chamber 651b is defined below the suction holding member 653 fitted in the recess 651a. This chamber 651b is in communication with suction means 69 through a communication line 652a formed in the work holding portion 651 and the supporting portion 652. Accordingly, when the workpiece is placed on the suction holding member 653 and the suction means 69 is operated to make the communication line 652a communicate with a vacuum source, a vacuum is applied to the chamber 651b to thereby hold the workpiece placed on the suction holding member 653 under suction. Further, when the suction means 69 is operated to make the communication line 652a communicate with the atmosphere, the suction holding of the workpiece held on the suction holding member 653 is canceled.

The lower portion of the work holding portion 651 constituting the lower electrode 65 is formed with a cooling passage 651c. One end of the cooling passage 651c is in communication with a coolant supply passage 652b formed in the supporting portion 652, and the other end of the cooling passage 651c is in communication with a coolant return passage 652c formed in the supporting portion 652. The coolant supply passage 652b and the coolant return passage 652c are in communication with coolant supplying means 70. Accordingly, when the coolant supplying means 70 is operated, a coolant is circulated through the coolant supply passage 652b, the cooling passage 651c, and the coolant return passage 652c. As a result, heat generated in plasma processing to be hereinafter described is transferred from the lower electrode 65 to the coolant, thereby preventing an abnormal rise in temperature of the lower electrode 65.

The upper electrode 66 is formed of a conductive material, and it is composed of a disk-shaped gas discharging portion 661 and a cylindrical supporting portion 662 projecting upward from the upper surface of the gas discharging portion 661 at a central portion thereof. The gas discharging portion 661 of the upper electrode 66 is opposed to the work holding portion 651 of the lower electrode 65. The supporting portion 662 of the upper electrode 66 is inserted through a hole 612a formed in the upper wall 612 of the housing 61 and is supported to a sealing member 71 mounted in the hole 612a so as to be vertically movable. An operating member 663 is mounted to the upper end portion of the supporting portion 662, and this operating member 663 is connected to driving means 72 for vertically moving the upper electrode 66. The upper electrode 66 is grounded through the supporting portion 662.

The disk-shaped gas discharging portion 661 constituting the upper electrode 66 is formed with a plurality of discharge ports 661a opening downward. These plural discharge ports 661a are in communication with $SF_6$ gas supplying means 73 and $C_4F_8$ gas supplying means 74 through a communication line 661b formed in the gas discharging portion 661 and a communication line 662a formed in the supporting portion 662.

The plasma etching apparatus 6 further includes control means 75 for controlling the gate operating means 63, the evacuating means 64, the RF power supply 68, the suction means 69, the coolant supplying means 70, the driving means 72, the $SF_6$ gas supplying means 73, and the $C_4F_8$ gas supplying means 74. Input into the control means 75 are data on the pressure in the enclosed space 61a defined by the housing 61 from the evacuating means 64, data on the coolant temperature (i.e., electrode temperature) from the coolant supplying means 70, and data on the gas flow from the $SF_6$ gas supplying means 73 and the $C_4F_8$ gas supplying means 74. The control means 75 then outputs control signals to these means according to the various input data mentioned above.

The plasma etching apparatus 6 mentioned above is used to perform the plasma etching step in such a manner that the silicon substrate 20 of the semiconductor wafer 2 is plasma-etched along each street 23 to the depth corresponding to the finished thickness of each device 22, thereby forming a division groove along each street 23 and that the modified layer 24 formed on the opposite sides of each street 23 in the functional layer removing step is also etched off.

First, the gate operating means 63 is operated to move the gate 62 downward as viewed in FIG. 6, thereby exposing the opening 614a formed in the right side wall 614 of the housing 61. Thereafter, loading/unloading means (not shown) is operated to load the semiconductor wafer 2 processed by the resist film forming step from the opening 614a into the enclosed space 61a defined by the housing 61 and then place the semiconductor wafer 2 on the suction holding member 653 of the work holding portion 651 constituting the lower electrode 65 in the condition where the back side 20b of the silicon substrate 20 constituting the semiconductor wafer 2 is in contact with the suction holding member 653. At this time, the upper electrode 66 is preliminarily raised by operating the driving means 72. Thereafter, the suction means 69 is operated to apply a vacuum to the chamber 651b, thereby holding the semiconductor wafer 2 on the suction holding member 653 under suction. Accordingly, the semiconductor wafer 2 is held on the suction holding member 653 in the condition where the photoresist film 5 formed on the front side 21a of the functional layer 21 in the area except each street 23 is oriented upward.

After holding the semiconductor wafer 2 on the suction holding member 653 under suction, the gate operating means 63 is operated to move the gate 62 upward as viewed in FIG. 6, thereby closing the opening 614a formed in the right side wall 614 of the housing 61. Thereafter, the driving means 72 is operated to lower the upper electrode 66, thereby setting the distance between the lower surface of the gas discharging portion 661 of the upper electrode 66 and the upper surface of the semiconductor wafer 2 (i.e., the upper surface of the photoresist film 5) held on the work holding portion 651 of the lower electrode 65 to a predetermined interelectrode distance (e.g., 10 mm) suitable for plasma etching.

Thereafter, the evacuating means 64 is operated to evacuate the enclosed space 61a defined by the housing 61. After evacuating the enclosed space 61a, a modified layer removing step is first performed in such a manner that the modified layer 24 formed on the opposite sides of each street 23 in the functional layer removing step is removed by plasma etching. The modified layer removing step is performed by operating the $SF_6$ gas supplying means 73 to supply an $SF_6$ gas for generation of a plasma to the upper electrode 66. The $SF_6$ gas supplied from the $SF_6$ gas supplying means 73 is fed through the communication line 662a formed in the supporting portion 662 and the communication line 661b formed in the gas discharging portion 661 to the plural discharge ports 661a. The $SF_6$ gas thus fed to the plural discharge ports 661a is discharged from the discharge ports 661a toward the functional layer 21 of the semiconductor wafer 2 held on the suction holding member 653 of the lower electrode 65 (the photoresist film 5 being formed on the front side 21a of the functional layer 21 in the area except each street 23). Further, the pressure of the $SF_6$ gas in the enclosed space 61a is maintained at a predetermined gas pressure (e.g., 20 Pa).

Figure 7A:
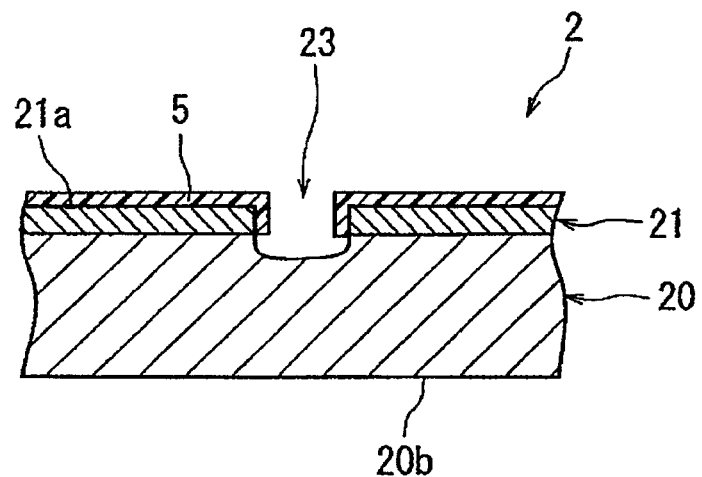
FIGS. 7A and 7B are sectional views for illustrating the plasma etching step.

In the condition where the $SF_6$ gas for generation of a plasma is supplied, the RF power supply 68 is operated to apply an RF power of 100 W, for example, to the lower electrode 65 and apply an RF power of 2000 W, for example, to the upper electrode 66. As a result, a plasma having isotropy is generated from the $SF_6$ gas in the space between the lower electrode 65 and the upper electrode 66, and a resultant active substance in the plasma state acts on the silicon substrate 20 of the semiconductor wafer 2 along each street 23 where the functional layer 21 has already been removed in the functional layer removing step. Accordingly, the modified layer 24 formed on the opposite sides of each street 23 in the functional layer removing step is etched off as shown in FIG. 7A.

For example, the modified layer removing step is performed under the following conditions.

Pressure in the enclosed space 61a: 20 Pa
RF power: lower electrode: 100 W
upper electrode: 2000 W
$SF_6$ gas flow rate: 1.5 liters/min
Etching time: 1 minute After performing the modified layer removing step mentioned above, a division groove forming step is performed in such a manner that the silicon substrate 20 of the semiconductor wafer 2 is plasma-etched along each street 23 where the functional layer 21 is absent to the depth corresponding to the finished thickness of each device 22, thereby forming a division groove along each street 23. This division groove forming step is performed by alternately operating the $SF_6$ gas supplying means 73 and the $C_4F_8$ gas supplying means 74 to supply an $SF_6$ gas and a $C_4F_8$ gas for generation of a plasma to the upper electrode 66. The $SF_6$ gas supplied from the $SF_6$ gas supplying means 73 and the $C_4F_8$ gas supplied from the $C_4F_8$ gas supplying means 74 are alternately fed through the communication line 662a formed in the supporting portion 662 and the communication line 661b formed in the gas discharging portion 661 to the plural discharge ports 661a. The $SF_6$ gas and the $C_4F_8$ gas thus fed to the plural discharge ports 661a are alternately discharged from the discharge ports 661a toward the functional layer 21 of the semiconductor wafer 2 held on the suction holding member 653 of the lower electrode 65 (the photoresist film 5 being formed on the front side 21a of the functional layer 21 in the area except each street 23). Further, the pressure of the $SF_6$ gas and the $C_4F_8$ gas in the enclosed space 61a is maintained at a predetermined gas pressure (e.g., 20 Pa).

Figure 7B:
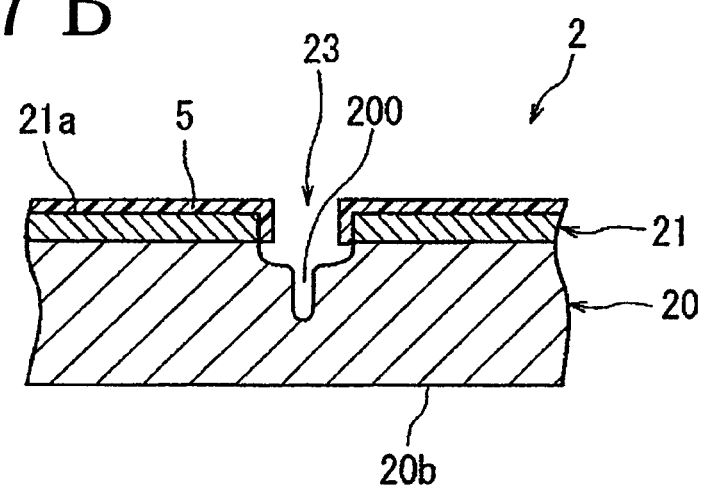

In the condition where the $SF_6$ gas and the $C_4F_8$ gas for generation of a plasma are alternately supplied, the RF power supply 68 is operated to apply an RF power of 50 W, for example, to the lower electrode 65 and apply an RF power of 3000 W, for example, to the upper electrode 66. As a result, a plasma having anisotropy is generated from the $SF_6$ gas and the $C_4F_8$ gas in the space between the lower electrode 65 and the upper electrode 66, and a resultant active substance in the plasma state acts on the silicon substrate 20 of the semiconductor wafer 2 along each street 23 where the modified layer 24 has already been removed in the modified layer removing step. Accordingly, a division groove 200 is formed on the silicon substrate 20 along each street 23 so as to have a depth extending toward the back side 20b of the silicon substrate 20 as shown in FIG. 7B. The depth of each division groove 200 is set to 350 μm, for example.

For example, the division groove forming step is performed under the following conditions.

Pressure in the enclosed space 61a: 20 Pa
RF power: lower electrode: 50 W
upper electrode: 3000 W
$SF_6$ gas flow rate: 1.0 liter/min
$C_4F_8$ gas flow rate: 0.7 liter/min
$SF_6$ gas supply interval: supply for 1 second at intervals of 2 seconds
$C_4F_8$ gas supply interval: supply for 2 seconds at intervals of 1 second
Etching time: 20 minutes After performing the plasma etching step mentioned above, a resist film removing step is performed by using a photoresist film remover known in the art to remove the photoresist film 5 formed on the front side 21a of the functional layer 21 of the semiconductor wafer 2 in the area except each street 23.

Figure 8A:
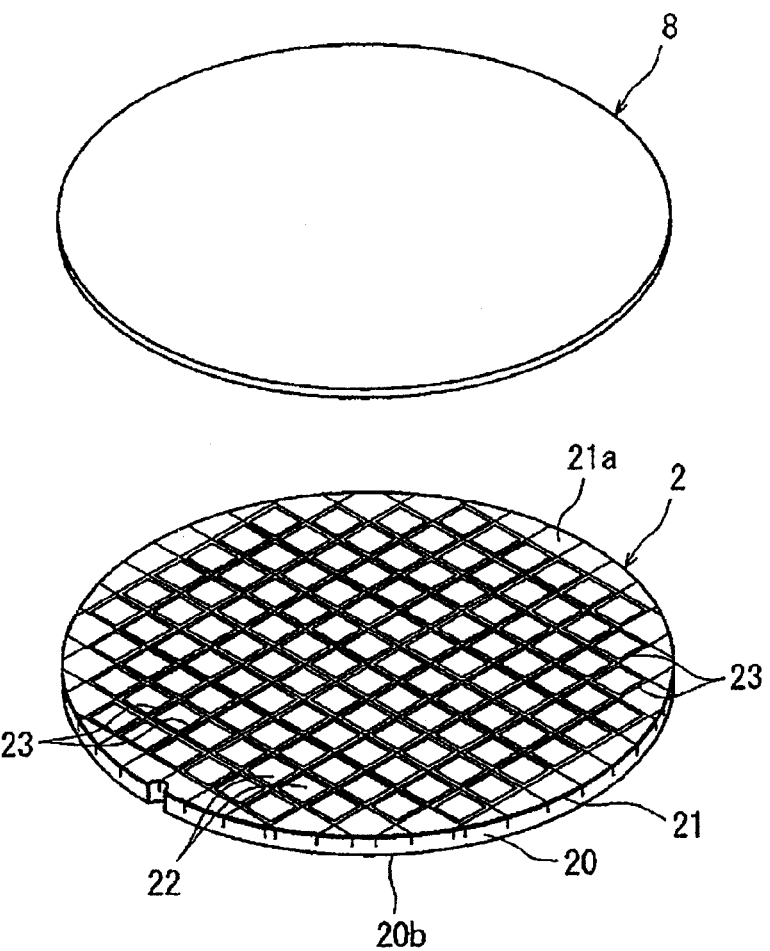
FIGS. 8A and 8B are perspective views for illustrating a protective member attaching step in the wafer processing method according to the present invention.
Figure 8B:
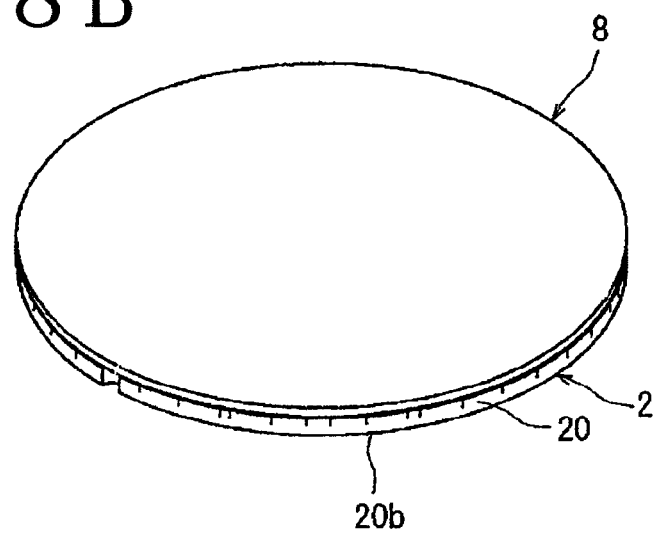

Thereafter, a protective member attaching step is performed in such a manner that a protective member is attached to the front side 21a of the functional layer 21 of the semiconductor wafer 2. More specifically, as shown in FIGS. 8A and 8B, a protective tape 8 as the protective member is attached to the front side 21a of the functional layer 21 of the semiconductor wafer 2. The protective tape 8 is composed of a base sheet and an adhesive layer formed on the base sheet by coating. The base sheet is formed of polyvinyl chloride (PVC) and has a thickness of 100 μm, for example. The adhesive layer is formed of acrylic resin and has a thickness of about 5 μm, for example.

After performing the protective member attaching step mentioned above, a back grinding step is performed in such a manner that the back side 20b of the silicon substrate 20 of the semiconductor wafer 2 is ground to reduce the thickness of the silicon substrate 20 to the finished thickness of each device 22, thereby exposing each division groove 200 to the back side 20b of the silicon substrate 20 and accordingly dividing the semiconductor wafer 2 into the individual devices 22. This back grinding step is performed by using a grinding apparatus 9 shown in FIG. 9A. The grinding apparatus 9 shown in FIG. 9A includes a chuck table 91 for holding a workpiece and grinding means 92 for grinding the workpiece held on the chuck table 91. The chuck table 91 has an upper surface as a holding surface for holding the workpiece under suction and is rotatable in the direction shown by an arrow 91a in FIG. 9A. The grinding means 92 includes a spindle housing 921, a rotating spindle 922 rotatably supported in the spindle housing 921 and rotatable by a rotational driving mechanism (not shown), a mounter 923 fixed to the lower end of the rotating spindle 922, and a grinding wheel 924 mounted on the lower surface of the mounter 923. The grinding wheel 924 is composed of a circular base 925 and a plurality of abrasive members 926 fixed to the lower surface of the circular base 925 so as to be arranged annularly. The circular base 925 is mounted to the lower surface of the mounter 923 by a plurality of bolts 927.

Figure 9A:
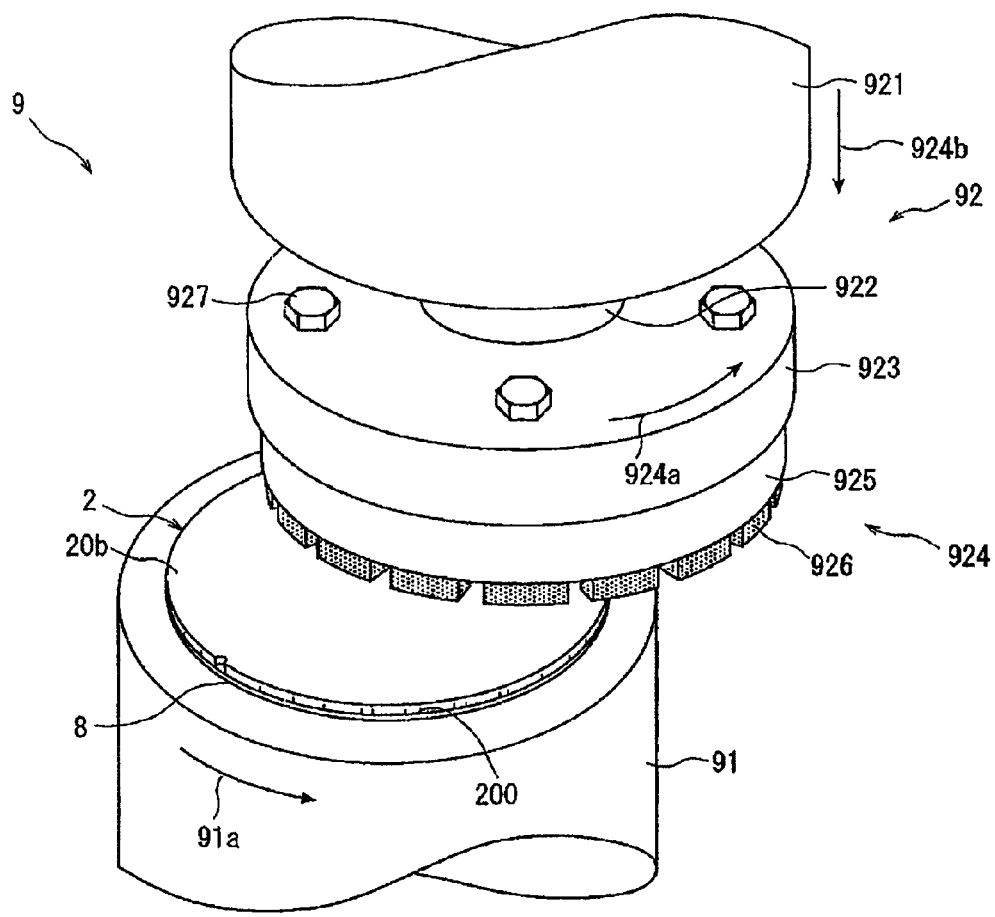
FIGS. 9A to 9C are views for illustrating a back grinding step in the wafer processing method according to the present invention.
Figure 9B:
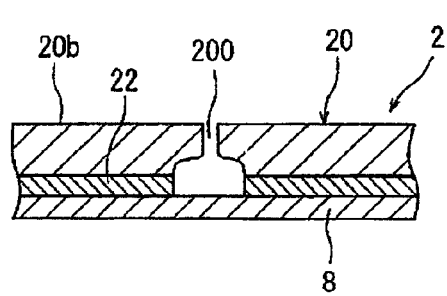
Figure 9C:
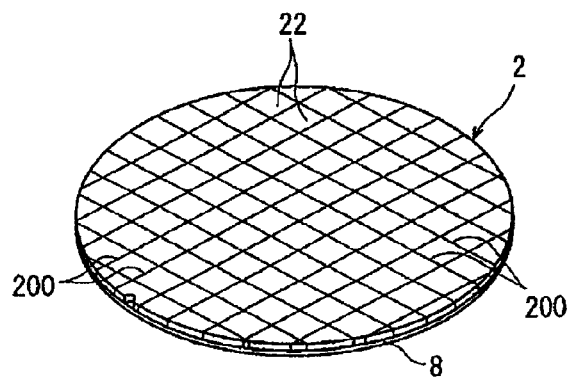

The back grinding step using the grinding apparatus 9 is performed in the following manner. First, the semiconductor wafer 2 is placed on the chuck table 91 in the condition where the protective tape 8 attached to the front side 21a of the functional layer 21 of the semiconductor wafer 2 comes into contact with the upper surface (holding surface) of the chuck table 91 as shown in FIG. 9A. Thereafter, suction means (not shown) is operated to hold the semiconductor wafer 2 through the protective tape 8 on the chuck table 91 under suction (wafer holding step). Accordingly, the back side 20b of the silicon substrate 20 of the semiconductor wafer 2 held on the chuck table 91 is oriented upward. In the condition where the semiconductor wafer 2 is held under suction on the chuck table 91 through the protective tape 8 as mentioned above, the chuck table 91 is rotated at 300 rpm, for example, in the direction shown by the arrow 91a in FIG. 9A. At the same time, the grinding wheel 924 of the grinding means 92 is also rotated at 6000 rpm, for example, in the direction shown by an arrow 924a in FIG. 9A. Thereafter, the grinding means 92 is lowered to bring the abrasive members 926 into contact with the back side 20b of the silicon substrate 20 of the semiconductor wafer 2 as a work surface. Further, the grinding wheel 924 is fed downward as shown by an arrow 924b in FIG. 9A at a predetermined feed speed to thereby grind the back side 20b of the silicon substrate 20 until the finished thickness (e.g., 300 μm) of each device 22 is reached. As a result, each division groove 200 is exposed to the back side 20b of the silicon substrate 20 of the semiconductor wafer 2 as shown in FIG. 9B, and the semiconductor wafer 2 is divided into the individual devices 22 along the streets 23 where the division grooves 200 are respectively formed as shown in FIG. 9C. In each device 22 obtained by dividing the semiconductor wafer 2 along the streets 23 as mentioned above, the modified layer 24 formed on the opposite sides of each street 23 in the functional layer removing step has been etched off by performing the modified layer removing step in the plasma etching step, so that the die strength of each device 22 can be improved.

Figure 10:
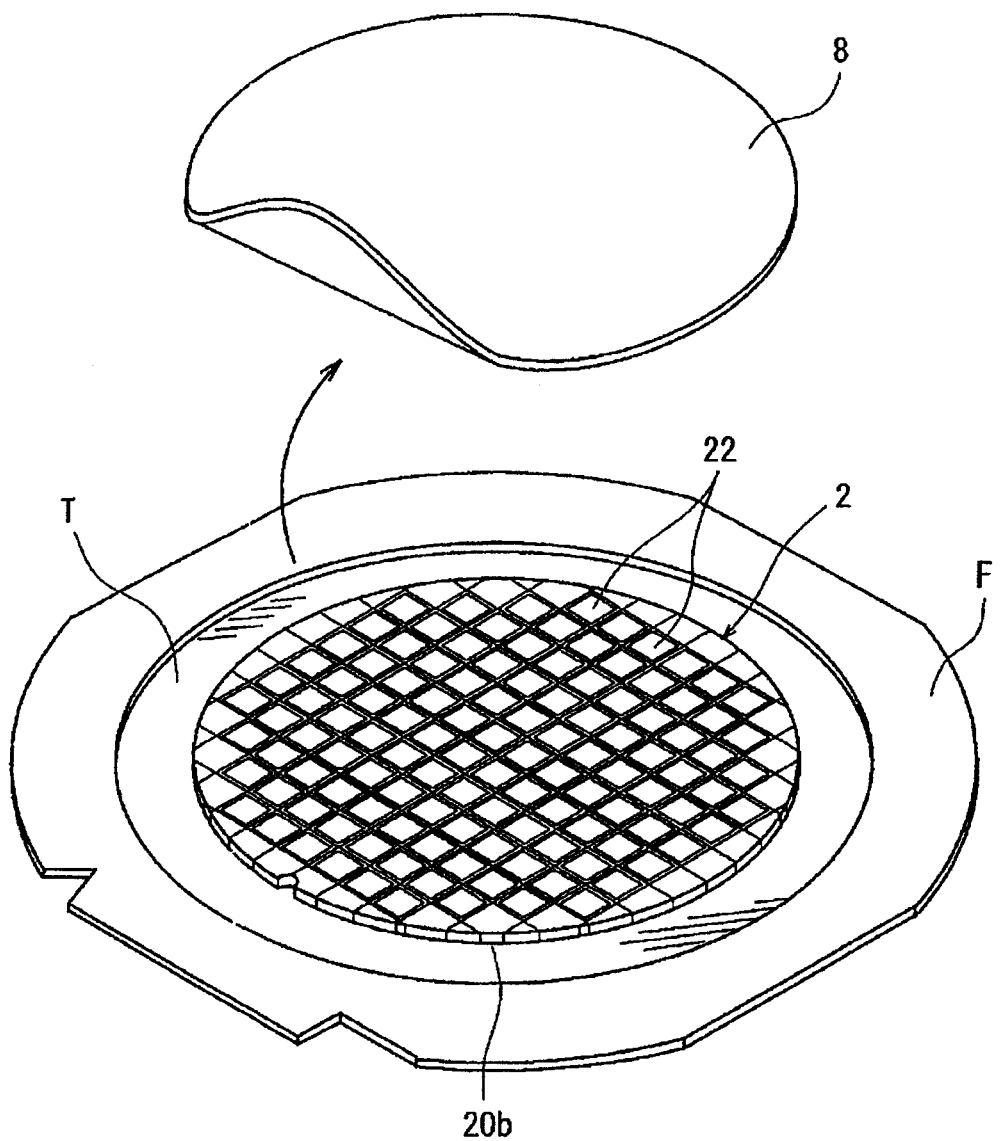
FIG. 10 is a perspective view for illustrating a wafer supporting step in the wafer processing method according to the present invention.

After performing the back grinding step mentioned above, a wafer supporting step is performed in such a manner that the back side 20b of the silicon substrate 20 of the semiconductor wafer 2 divided into the individual devices 22 is attached to an adhesive tape supported to an annular frame and that the protective member attached to the front side 21a of the functional layer 21 of the semiconductor wafer 2 is peeled off. More specifically, as shown in FIG. 10, the back side 20b of the silicon substrate 20 of the semiconductor wafer 2 divided into the individual devices 22 is attached to an adhesive tape T supported to an annular frame F. Accordingly, the protective tape 8 as the protective member attached to the front side 21a of the functional layer 21 of the semiconductor wafer 2 is oriented upward. Thereafter, the protective tape 8 is peeled from the front side 21a of the functional layer 21 of the semiconductor wafer 2. Thereafter, the semiconductor wafer 2 divided into the individual devices 22 and supported through the adhesive tape T to the annular frame F is transported to a pickup apparatus (not shown) for performing a pickup step as the next step.

In the above preferred embodiment, the protective tape 8 is attached to the front side 21a of the functional layer 21 of the semiconductor wafer 2 after removing the photoresist film 5 from the front side 21a of the functional layer 21. Thereafter, the back grinding step is performed. As a modification, the protective tape 8 may be attached to the photoresist film 5 formed on the front side 21a of the functional layer 21, and the back grinding step may be next performed. Thereafter, the protective tape 8 and the photoresist film 5 may be removed from the front side 21a of the functional layer 21 in the wafer supporting step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual devices along a plurality of crossing streets formed on a front side of said wafer, said wafer being composed of a substrate and a functional layer formed on a front side of said substrate, said individual devices being formed from said functional layer and partitioned by said streets, said wafer processing method comprising:

a protective film forming step of applying a liquid resin to a front side of said functional layer of said wafer to thereby form a protective film;

a functional layer removing step of applying a laser beam along said streets formed on said wafer from the front side of said functional layer of said wafer to thereby remove said functional layer along said streets, wherein said functional layer removing step is performed after said protective film forming step;

a resist film forming step of forming a resist film on the front side of said functional layer of said wafer in an area except each street after performing said functional layer removing step;

a plasma etching step of plasma-etching said substrate of said wafer along each street where said functional layer is absent to the depth corresponding to the finished thickness of each device after performing said resist film forming step, thereby forming a division groove along each street and also etching off a modified layer formed on the opposite sides of each street in said functional layer removing step;

a protective member attaching step of attaching a protective member to the front side of said functional layer of said wafer after performing said plasma etching step; and a back grinding step of grinding a back side of said substrate to reduce the thickness of said substrate to the finished thickness of each device after performing said protective member attaching step, thereby exposing each division groove to the back side of said substrate and accordingly dividing said wafer into said individual devices.

2. The wafer processing method according to claim 1, wherein said plasma etching step includes a modified layer removing step of removing said modified layer formed on the opposite sides of each street by using SF6 and a division groove forming step of forming said division groove along each street by alternately using SF6 and C4F8.

3. The wafer processing method according to claim 1, comprising:

a wafer supporting step of attaching the back side of said substrate of said wafer to an adhesive tape supported to an annular frame and peeling off said protective member attached to the front side of said functional layer of said wafer after performing said back grinding step.

\* \* \* \* \*